US011018230B1

(12) United States Patent
Vanhoucke et al.

(10) Patent No.: US 11,018,230 B1
(45) Date of Patent: May 25, 2021

(54) SEMICONDUCTOR DEVICES WITH A MIXED CRYSTAL REGION

(71) Applicant: NXP B.V., Eindhoven (NL)

(72) Inventors: Tony Vanhoucke, Bierbeek (BE); Mahmoud Shehab Mohammad Al-Sa'di, Kranenburg (DE); Johannes Josephus Theodorus Marinus Donkers, Valkenswaard (NL); Jan Willem Slotboom, Eersel (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/723,311

(22) Filed: Dec. 20, 2019

(51) Int. Cl.
*H01L 29/165* (2006.01)
*H01L 29/737* (2006.01)
*H01L 29/868* (2006.01)

(52) U.S. Cl.
CPC .......... *H01L 29/165* (2013.01); *H01L 29/737* (2013.01); *H01L 29/868* (2013.01)

(58) Field of Classification Search
CPC .... H01L 29/165; H01L 29/737; H01L 29/868
See application file for complete search history.

(56) References Cited

U.S. PATENT DOCUMENTS

| | | | | |
|---|---|---|---|---|
| 6,211,560 B1 * | 4/2001 | Jimenez | ................ | H01L 31/108 257/451 |
| 9,704,966 B1 * | 7/2017 | Singh | .................. | H01L 29/0657 |
| 10,490,407 B2 | 11/2019 | Al-Sa'di | | |
| 2004/0207051 A1 * | 10/2004 | Takizawa | .............. | H01L 29/861 257/658 |
| 2006/0138580 A1 * | 6/2006 | Kim | ...................... | H01L 31/103 257/461 |
| 2008/0230808 A1 * | 9/2008 | Aoki | ................... | H01L 29/7378 257/197 |
| 2011/0084308 A1 * | 4/2011 | Loh | ................... | H01L 21/02502 257/190 |

(Continued)

OTHER PUBLICATIONS

Lombardo, S. et al.; "Si/GexSi1-x Heterojunction Bipolar Transistors with the GexSi1-x Base Formed by Ge Ion Implantation in Si;" Published in: IEEE Electron Device Letters (vol. 17, No. 10); Date of Publication Oct. 1996; DOI: 10.1109/55.537083.

(Continued)

*Primary Examiner* — Victor A Mandala
(74) *Attorney, Agent, or Firm* — Bruce M. Green

(57) ABSTRACT

An embodiment of a semiconductor device may include a semiconductor substrate, a first semiconductor region comprising a first material with a first polarity formed within the semiconductor substrate and a second semiconductor region comprising the first material with a second polarity formed within the semiconductor substrate and coupled to the first semiconductor region. In an embodiment, a semiconductor device may also include a first electrode coupled to the first semiconductor region, a second electrode coupled to the second semiconductor region, and a depletion region formed between the first semiconductor region and the second semiconductor region. The depletion region may include a mixed crystal region that includes a mixed crystal alloy of the first material and a second material, wherein the mixed crystal region has a lower bandgap energy than a bandgap energy of the first material.

18 Claims, 6 Drawing Sheets

(56) References Cited

U.S. PATENT DOCUMENTS

| | | | |
|---|---|---|---|
| 2015/0228738 A1* | 8/2015 | Tsai | H01L 29/42324 |
| | | | 257/315 |
| 2017/0221994 A1 | 8/2017 | Al-Sa'di | |
| 2018/0130804 A1* | 5/2018 | Luan | H01L 21/8229 |
| 2020/0066599 A1* | 2/2020 | Zhang | H01L 21/823437 |
| 2020/0116928 A1* | 4/2020 | Kim | G02B 6/124 |
| 2020/0152816 A1* | 5/2020 | Schueppen | H01L 31/0745 |

OTHER PUBLICATIONS

Mitchell M. et al; "A Comparison of PNP and NPN SiGe Heterojunction Bipolar Transistors Fabricated by Ge (+)-implantation;" 30th European Solid-State Device Research Conference; Sep. 11-13, 2000; Cork, Ireland: DOI: 10.1109/ESSDERC.2000.194761.

Sun, Pinping et al.; "A Novel SiGe PIN Diode SPST Switch for Broadband T/R Module;" Published in IEEE Microwave and Wireless Components Letters (vol. 17. No. 5 , May 2007); Date of Publication Apr. 30, 2007; DOI: 10.1109/LMWC.2007.895706.

Wang, Jian et al; "Ge-Photodetectors for Si-Based Optoelectronic Integration;" Sensors 2011, 11(1), 696-718; https://doi.org/10.3390/s110100696; Department of Electrical and Computer Engineering, National University of Singapore; EPublished: Jan. 12, 2011.

Wohl, G. et al.; "SiGe Pin-Photodetectors Integrated on Silicon Substrates for Optical Fiber Links;" 2003 IEEE International Solid-State Circuits Conference, Digest of Technical Papers. ISSCC; Date of Conference Feb. 13, 2003, San Francisco, CA; DOI: 10.1109/ISSCC.2003.1234341.

U.S. Appl. No. 16/431,056; Inventor: Tony Vanhoucke, et al.; "Semiconductor Device With an Encircled Electrode;", filed Jun. 4, 2019.

* cited by examiner

SEMICONDUCTOR DEVICES WITH A MIXED CRYSTAL REGION

TECHNICAL FIELD

Embodiments of the subject matter described herein relate generally to semiconductor devices, including diodes.

BACKGROUND

Semiconductor devices find application in a wide variety of electronic components and systems. Useful semiconductor devices for radio frequency (RF) and high-speed switching and control applications include p-i-n diodes, p-n diodes, Schottky diodes, and related devices. In particular, p-n and p-i-n diodes are useful in high frequency and high-power rectifier applications because of their low capacitance, high breakdown voltage, and tune-able capacitance range. These diode devices act as bias-controlled capacitors/resistors and find applications as RF switches, phase shifters, and limiters. In these and other applications for these devices, there is a need for reduced device resistance. Reduced device resistance is important for reduced switching losses and improved frequency response for these applications. Thus, semiconductor devices, including p-i-n diodes, with reduced resistance are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
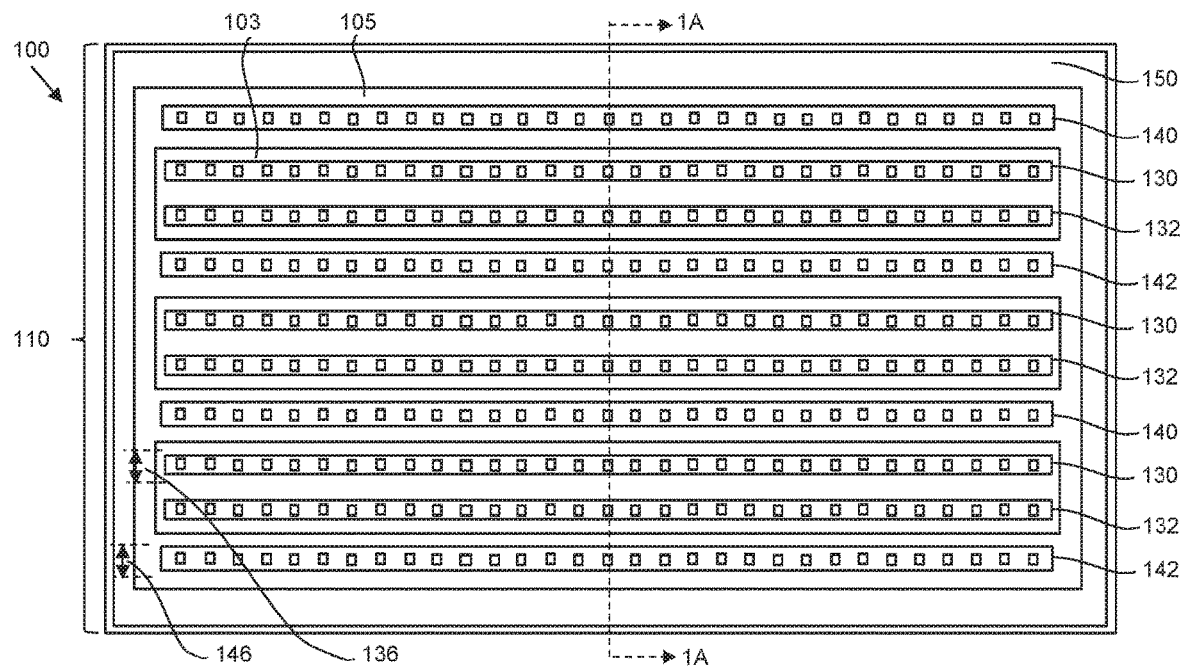
FIG. 1 is a top view of a semiconductor device in accordance with an embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

In one aspect, an embodiment of a semiconductor device may include a semiconductor substrate, a first semiconductor region comprising a first material with a first polarity formed within the semiconductor substrate, and a second semiconductor region comprising the first material with a second polarity formed within the semiconductor substrate and coupled to the first semiconductor region. In an embodiment, a semiconductor device may also include a first electrode coupled to the first semiconductor region, a second electrode coupled to the second semiconductor region, and a depletion region formed between the first semiconductor region and the second semiconductor region. The depletion region may include a mixed crystal region that includes a mixed crystal alloy of the first material and a second material, wherein the mixed crystal region has a lower bandgap energy than a bandgap energy of the first material. In an embodiment, the mixed crystal region may be within the depletion region. In an embodiment, the polarity of the first semiconductor region may be p-type and the polarity of the second semiconductor region may be n-type. In an embodiment, the first electrode may be configured as an anode and the second electrode may be configured as a cathode. In some embodiments, the mixed crystal region may include an intrinsically doped semiconductor. An isolation region may be adjacent the first semiconductor region and the second semiconductor region, according to an embodiment. In an embodiment, the first material and the semiconductor substrate may comprise silicon (Si) and the second material may comprise germanium (Ge) to form a silicon germanium (SiGe) mixed crystal. In an embodiment, a Ge mole fraction of the mixed crystal region may exceed ten percent. In other embodiments, the Ge mole fraction of the mixed crystal region may exceed twenty percent. In still other embodiments, the Ge mole fraction of the mixed crystal region may exceed thirty percent. In an embodiment, the Ge mole fraction and thickness of the mixed crystal region may be configured so that the mixed crystal region has a metastable characteristic.

In another aspect, the inventive subject matter may include a diode device that includes a silicon substrate, a first semiconductor region comprising silicon of a first polarity formed within the silicon substrate, and a second semiconductor region comprising silicon of a second polarity formed within the silicon substrate and coupled to the first semiconductor region. According to an embodiment, a first electrode may be coupled to the first semiconductor region, a second electrode may be coupled to the second semiconductor region, and an isolation region may be adjacent the first semiconductor region and the second semiconductor region. A depletion region may be formed between the first semiconductor region and the second semiconductor region and a mixed crystal region may be formed within the depletion region, wherein the mixed crystal region includes a mixed crystal alloy of SiGe, and wherein the mixed crystal region has a lower bandgap energy than a bandgap energy of the first semiconductor region, according to an embodiment. In an embodiment, the first semiconductor region of the first polarity is a p-type semiconductor and the second semiconductor region of the second polarity is a n-type semiconductor. In an embodiment, a third semiconductor region may be formed between the first semiconductor region and the second semiconductor region, wherein at least a portion of the mixed crystal region includes the third semiconductor region, and wherein the third semiconductor region may include an intrinsically doped semiconductor. In some embodiments, a Ge mole fraction of the mixed crystal region may exceed ten percent. In other embodiments, the Ge mole fraction of the mixed crystal region may exceed twenty percent. In still other embodiments, the Ge mole fraction of the mixed crystal region exceeds thirty percent.

In still another aspect, the inventive subject matter may include a radio frequency switch device that includes a silicon substrate, a first semiconductor region comprising p-type silicon formed within the silicon substrate, and a second semiconductor region comprising n-type silicon formed under the first semiconductor region. In an embodiment, a first electrode, configured as an anode, may be formed over and coupled to the first semiconductor region. A second electrode, configured as a cathode, may be formed adjacent the first electrode and coupled to the second semiconductor region, according to an embodiment. An isolation region may be formed adjacent the first semiconductor region and the second semiconductor region, in an embodiment. In an embodiment, a depletion region may be formed between the first semiconductor region and the second semiconductor region. A mixed crystal region may be formed within the depletion region that may include a mixed crystal alloy of silicon germanium, wherein the mixed crystal region has a lower bandgap energy than a bandgap energy of silicon. In an embodiment, a third semiconductor region comprising p-type silicon may be formed within the silicon substrate and over the second semiconductor region. A third electrode may be formed over and coupled to the third semiconductor region and the first electrode according to an embodiment. In an embodiment, a fourth electrode may be formed over and coupled to the second semiconductor region and a mixed crystal region may be formed within the depletion region and may include a mixed crystal alloy of silicon germanium. The mixed crystal region may have a lower bandgap energy than a bandgap energy of silicon, according to an embodiment. In an embodiment, a third semiconductor region may be formed between the first semiconductor region and the second semiconductor region, wherein at least a portion of the mixed crystal region may include the third semiconductor region. In an embodiment, the third semiconductor region may include an intrinsically doped semiconductor.

FIG. 1 is a top view of a semiconductor device 100 in accordance with an embodiment. In an embodiment, the semiconductor device 100 may include a semiconductor substrate 110. A first semiconductor region 103 that includes a first material having a first polarity may be formed within the semiconductor substrate 110. A second semiconductor region 105 that includes the first material having a second polarity may be formed within the semiconductor substrate 110 and coupled to the first semiconductor region 103. In an embodiment, a semiconductor device 100 may also include a first electrode 130 coupled to the first semiconductor region 103 and a second electrode 140 coupled to the second semiconductor region 105. In an embodiment, the first electrode 130 may be configured as an anode and the second electrode 140 may be configured as a cathode. An isolation region 150 may be formed adjacent the first semiconductor region 103 and the second semiconductor region 105, according to an embodiment.

Figure 1A:
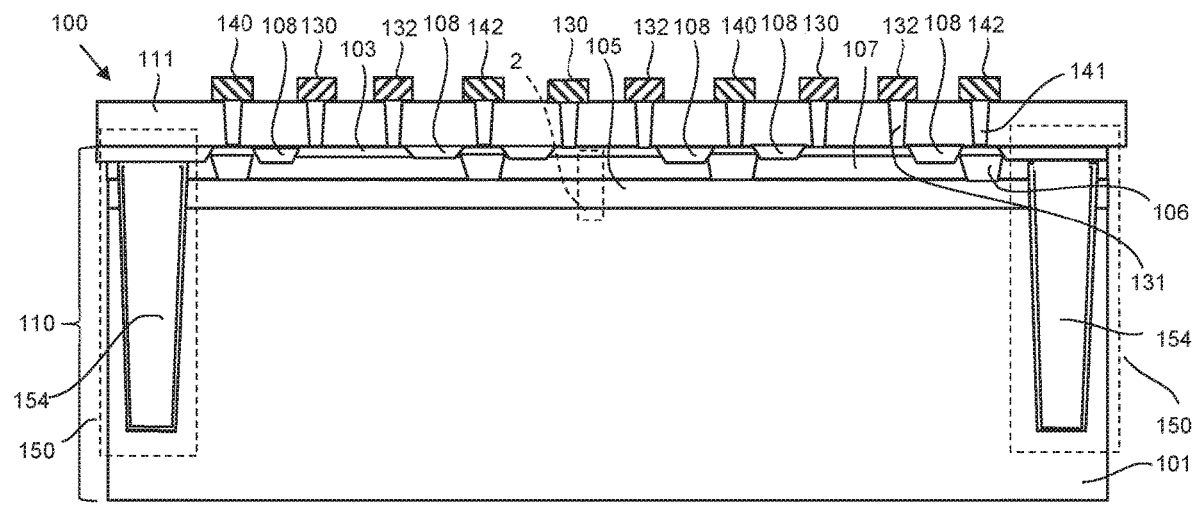
FIG. 1A is a cross sectional view of the semiconductor device of FIG. 1 along line 1A-1A, in accordance with an embodiment.
Figure 2:
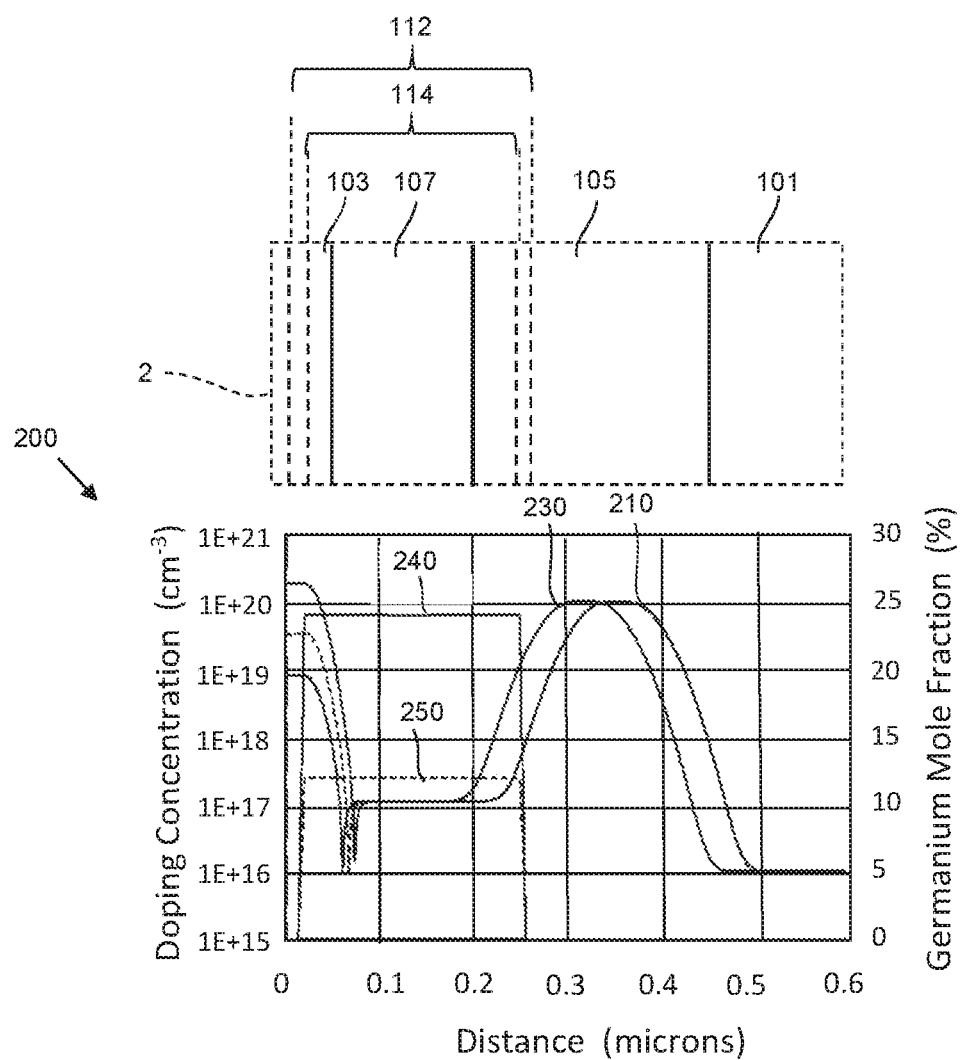
FIG. 2 is a view of an area of FIG. 1A aligned with a chart of dopant concentration and germanium mole fraction in comparison to that of a conventional device.

FIG. 1A is a cross sectional view of the semiconductor device 100 of FIG. 1 along line 1A-1A, in accordance with an embodiment. FIG. 2 is a view of area 2 in FIG. 1A aligned with a chart 200 of dopant concentration and germanium mole fraction of the area 111 in comparison to that of a conventional device. Referring simultaneously to FIG. 1 and the associated cross section of FIG. 1 along cut line 1A-1A, as shown in FIG. 1A, and view 2 shown in FIG. 2, the semiconductor substrate 110 may include a number of semiconductor regions. As used herein, the term, "semiconductor region" may refer to single or multiple semiconductor regions that may include regions formed by implantation (e.g. ion implantation) or layers grown by epitaxial growth. In an embodiment, the first semiconductor region 103 and the second semiconductor region 105 may be formed within the semiconductor substrate 110. In an embodiment, the second semiconductor region 105 may be formed over or within a portion of a bulk substrate 101. Referring to view 2 of FIG. 2, in an embodiment, a depletion region 112 may form between the first semiconductor region 103 and the second semiconductor region 105. As used herein, the term "depletion region" refers to a region within a semiconducting material devoid of mobile charge carriers (e.g. electrons or holes) as a result of diffusion or and electric field. Such a condition arises, for example and in an embodiment, in a p-n junction where excess electrons in an n-type semiconductor diffuse into a p-type semiconductor and excess holes in the p-type semiconductor diffuse into the n-type semiconductor. A depletion region develops at the interface of these p-type and n-type semiconductors. The semiconductor substrate 110 may include a mixed crystal region 114 within the depletion region 112. As used herein, the term, "mixed crystal region" may refer to a semiconductor region where two or more compounds (e.g. Si and Ge) are used to form the semiconductor region. In an embodiment, the mixed crystal region 114 may include a mixed crystal of the first material (e.g. Si) and a second material (e.g. germanium). In an embodiment, the mixed crystal region 114 (e.g. SiGe) may have a lower bandgap energy than a bandgap energy of the first material (e.g. Si). In other embodiments, the mixed crystal region 114 may have a higher bandgap energy than a bandgap energy of the first material. Because of the difference in bandgap, and in an embodiment, the interface between the mixed crystal region 114 and portions of the first semiconductor region 103 or second semiconductor region 105 may form a heterojunction barrier between the mixed crystal region 114 and the other portions of the first or second semiconductor regions 103 and 105. In an embodiment, the polarity of the first semiconductor region 103 may be p-type and the polarity of the second semiconductor region 105 may be n-type. A third semiconductor region 107 may be formed between the first semiconductor region 103 and the second semiconductor region 105, according to an embodiment. According to an embodiment, the first semiconductor region 103 may be formed over the second semiconductor region 105. In an embodiment, the third semiconductor region 107 may formed between the first semiconductor region 103 and over the second semiconductor region 105.

In an embodiment, the semiconductor substrate 110 may include one or more of Si, G), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SiC), sapphire, or other suitable materials. In other embodiments, the semiconductor substrate 110 may include Si on insulator (SOI). In an embodiment, the first, second, and third semiconductor regions 103, 105, and 107 may include one or more of Si, Ge, and silicon germanium (SiGe). In other embodiments, the first, second, and third semiconductor regions 103, 105, and 107 may include one or more of GaAs, GaN, AlN, InN, InGaP, and/or other suitable materials. In an embodiment, the first semiconductor region 103 may include a p-type semiconductor, the second semiconductor region 105 may include an n-type semiconductor, and the third semiconductor region 107 may include an intrinsic semiconductor. As used herein, the term "p-type semiconductor" refers to a semiconductor material with a hole concentration ranging from about $10^{15}$ cm$^{-3}$ to about $10^{20}$ cm$^{-3}$, though other higher or lower hole concentrations may be included. As used herein, the term "n-type semiconductor" refers to a semiconductor material with a net electron concentration ranging from about $10^{15}$ cm$^{-3}$ to about $10^{2}$ cm$^{-3}$, though other higher or lower electron concentrations may be included. As used herein, the term "intrinsic semiconductor" refers to a semiconductor material with an electron or hole concentration ranging from about $10^{13}$ cm$^{-3}$ to about $10^{16}$ cm$^{-3}$, though other higher or lower electron or hole concentrations may be included. In an embodiment, and as shown in trace 210 of FIG. 2, one or more of the first, second, and third semiconductor regions 103, 105, and 107 may be intentionally doped. In other embodiments, one or more of the first, second, and third semiconductor regions 103, 105, and 107 may be un-intentionally doped. In some embodiments, the first semiconductor region 103 may include an intentionally doped p-type semiconductor, the second semiconductor region 105 may include an intentionally doped n-type semiconductor, and the third semiconductor region 107 may include an unintentionally-doped or lightly-doped (e.g. n-type) intrinsic semiconductor. In other embodiments, the first semiconductor region 103 may include an intentionally doped n-type semiconductor, the second semiconductor region 105 may include an intentionally doped p-type semiconductor, and the third semiconductor region 107 may include an unintentionally-doped or lightly-doped (e.g. p-type) intrinsic semiconductor. In an embodiment, one or more of the first, second, and third semiconductor regions 103, 105, and 107 may include implanted regions (i.e. doped by ion implantation) formed in the semiconductor substrate 110. Without departing from the scope of the inventive subject matter, one or more of the first, second, and third semiconductor regions 103, 105, and 107 may include epitaxially grown semiconductor layers.

In an embodiment, the first semiconductor region 103 may have a thickness of between about 100 angstroms and 1000 angstroms. In other embodiments, the first semiconductor region 103 may have a thickness between about 50 angstroms and about 5000 angstroms, though other thicknesses may be used. In an embodiment, the second semiconductor region 105 may have a thickness of between about 100 angstroms and 1000 angstroms. In other embodiments, the second semiconductor region 105 may have a thickness between about 50 angstroms and about 10000 angstroms, though other thicknesses may be used. In an embodiment, the third semiconductor region 107 may have a thickness of between about 100 angstroms and 1000 angstroms. In other embodiments, the third semiconductor region 107 may have a thickness between about 50 angstroms and about 5000 angstroms, though other thicknesses may be used.

Referring to FIGS. 1A and FIG. 2, view 2, the mixed crystal region 114 may extend into one or both of the first semiconductor region 103 and the second semiconductor 105, according to an embodiment and may have a dopant profile represented by trace 210. In comparison, a conventional device has no mixed crystal region and has a doping profile represented by trace 230. As shown in traces 240 and 250, the mixed crystal region 114 (e.g. SiGe) may encompass all of the third semiconductor region 107, according to an embodiment. In other embodiments, the mixed crystal region 114 may encompass all of the first semiconductor region 103 and all of the second semiconductor region 105 while the third semiconductor region 107 may be omitted, resulting in a p-n junction between the first semiconductor region 103 and the second semiconductor region 105 (not shown). In other embodiments, the mixed crystal region 114 may have a thickness of between about 100 angstroms and 1000 angstroms. In other embodiments, the mixed crystal region 114 may have a thickness between about 50 angstroms and about 5000 angstroms, though other thicknesses may be used. Without departing from the scope of the inventive subject matter, the Ge mole fraction may not be constant throughout the mixed crystal region 114, according to an embodiment. In these embodiments, the Ge mole fraction within the mixed crystal region 114 may have multiple stepped sections of varying values or may be continuously graded.

In an embodiment, and referring again to FIGS. 1A and 2 and view 2, the depletion region 112 may extend into the first and second semiconductor regions 103 and 105 and encompasses the entirety of the third semiconductor region 7. In an embodiment, the mixed crystal region 114 may be completely contained within the depletion region 112. In other embodiments (not shown), the mixed crystal region 114 may extend beyond the depletion region 112. In other embodiments, the first and second semiconductor regions 103 and 105 may be in direct contact and a third semiconductor region 107 may not be included (not shown). In these other embodiments, the mixed crystal region 114 may extend beyond the depletion region 112.

In an embodiment, the semiconductor device 100 may be formed as part of a SiGe bipolar complementary metal oxide semiconductor process (not shown). In an embodiment, an n-type collector region may be formed in a semiconductor substrate and a p-type (boron (B)-doped) base region may be formed over the collector region. In an embodiment, the collector region may serve as a cathode and the base region may serve as an anode for a diode device or for a radio frequency switch device. In an embodiment, it may be desired to limit the steepness of the B profile to enhance the diffusion capacitance between the anode (collector region) and cathode of an RF switch. In an embodiment, the collector region may include an n-type SiGe layer with a thickness of between about 100 and 200 nm with a Ge mole fraction of between, for example, 10 and 15 percent. A p-type (e.g. boron (B)-doped) base region with a thickness of between about 100 angstroms and about 300 angstroms and a Ge mole fraction of between about 15 and 30 percent may be formed over the collector region according to an embodiment. In an embodiment, a B-doped poly silicon layer may be grown over the collector layer before the formation of the base region to form an extrinsic base region for a low resistance connection to the base region. In an embodiment, the B-doped poly silicon layer may advantageously diffuse additional B into the collector layer. In an embodiment, a depletion region between the base region and the collector region may include a portion of the collector region. In an embodiment, the base and the collector region may be grown using epitaxial layers. In other embodiments, the base and collector regions may be formed by ion implantation. In an embodiment Ge may be implanted into the base and collector regions. Without departing from the scope of the inventive subject matter, the semiconductor device 100 may be formed as part of a stand-alone or dedicated diode or RF switch process, wherein transistors and other active and passive components are not formed during the process of fabricating semiconductor device 100.

Referring again to FIGS. 1 and 1A, and in an embodiment, the anodes (e.g. first and second anode 130 and 132) may include a top conductive layer that is coupled to the first semiconductor region 103. In an embodiment, the top conductive layer may be formed from one or more of poly-silicon, aluminum (Al), copper (Cu), tungsten (W), titanium (Ti), gold (Au), or other suitable electrically conducting materials. In an embodiment, an anode length 136 used to form first, second anodes 130, 132, and other anodes may between about 0.1 microns and about 0.5 microns. In other embodiments, the anode length 136 may be between about 0.1 microns and about 10 microns. In an embodiment, the first contact vias 131 may couple one or more anodes (i.e. first anode 130, second anode 132, etc.) to the first semiconductor region 103 (e.g. p-type semiconductor). In an embodiment, the first contact vias 131 may be formed in an inter-layer dielectric 111 formed over the first semiconductor region 103 and may be filled with one or more of W, Cu, Al, Ti, Au, or other suitable conductive materials.

Referring again to FIGS. 1 and 1A, the cathodes (e.g. first and second cathodes 140 and 142 as well as other cathodes) may include a top conductive layer that is coupled to the second semiconductor region 105. In an embodiment, the top conductive layer may be formed from one or more of poly-silicon, Al, Cu, W, Ti, Au, or other suitable electrically conducting materials. In an embodiment, the cathodes (e.g. first and second cathodes 140 and 142) may be coupled to a common potential or connection point (not shown). In an embodiment, a cathode length 146 used to form, e.g., the second cathode 142, the exterior cathode 190, and other cathodes may between about 0.1 microns and about 0.5 microns. In other embodiments, the cathode length 146 may be between about 0.1 microns and about 10 microns. A second semiconductor contact region 106 (e.g. heavily doped n+ semiconductor region) may couple one or more cathodes (i.e. first cathode 140, second cathode 142, etc.) to the second semiconductor region 105 (e.g. n-type semiconductor), according to an embodiment. In an embodiment, one or more shallow isolation region(s) 108 may isolate portions of the first semiconductor region 103 from the second semiconductor contact region(s) 106. In an embodiment, the shallow isolation regions 108, may include ion implanted regions wherein damage to the crystal structure renders these regions substantially semi-insulating or highly resistive.

Referring again to FIGS. 1 and 1A, and in an embodiment, the isolation region 150 may be formed within the semiconductor substrate 110 to electrically isolate the semiconductor device 100 from other devices formed over or within the semiconductor substrate 110. According to an embodiment, the isolation region 150 may include any region formed within or over the semiconductor region 110 that substantially isolates the semiconductor device 100 from other devices within the semiconductor substrate 110. As used herein, the term "isolates" means to prevent or substantially limit electrical coupling, mechanical coupling, or other coupling between devices. In an embodiment, the isolation region 150 may include deep trench isolation (DTI) wherein an etched portion 154 of the semiconductor substrate 110 is removed (e.g. by dry etching) and then filling the etched portion 154 with an insulating or highly resistive material (e.g. silicon dioxide, silicon nitride, poly Si, or Si) to form the isolation region 150. In some embodiments, the etched portion 154 may include a doped layer (e.g. p-type layer) to enhance the isolation properties of the isolation region 150. In other embodiments, the isolation region 150 may include implanted regions of the semiconductor substrate 110.

Referring again to FIGS. 1 and 1A, a first anode 130 (i.e. first electrode) may be coupled to a first cathode 140 (i.e. second electrode) through the p-i-n junction formed by the electrical coupling of the first semiconductor region 103 (e.g. p-type layer), the third semiconductor layer 107 (intrinsic layer), and the second semiconductor layer 105 (n-type layer). According to an embodiment, a second anode 132 (i.e. third electrode) may be coupled to the first anode 130 by a common connection (e.g. metal or other highly conducting material). In an embodiment, the first anode 130 may be coupled to the second cathode 142 (i.e. fourth electrode) through the p-i-n junction in the first, second, and third semiconductor regions 103, 105, and 107, respectively. In an embodiment, the first anode 130 may include one or more segments and may be coupled to the first semiconductor region 103 (e.g. p-type semiconductor) through one or more first contact vias 131 coupled to the first semiconductor region 103 within the semiconductor substrate 110. According to an embodiment, the first cathode 140 may be coupled to the second semiconductor region 105 (e.g. n-type semiconductor) through one or more second contact vias 141 coupled to the second semiconductor region 105. In an embodiment, the second contact vias 141 may be coupled to the second semiconductor layer 105 through the second semiconductor contact region 106. In an embodiment, the first anode 130 may encircle the first cathode 140 (not shown).

Figure 3:
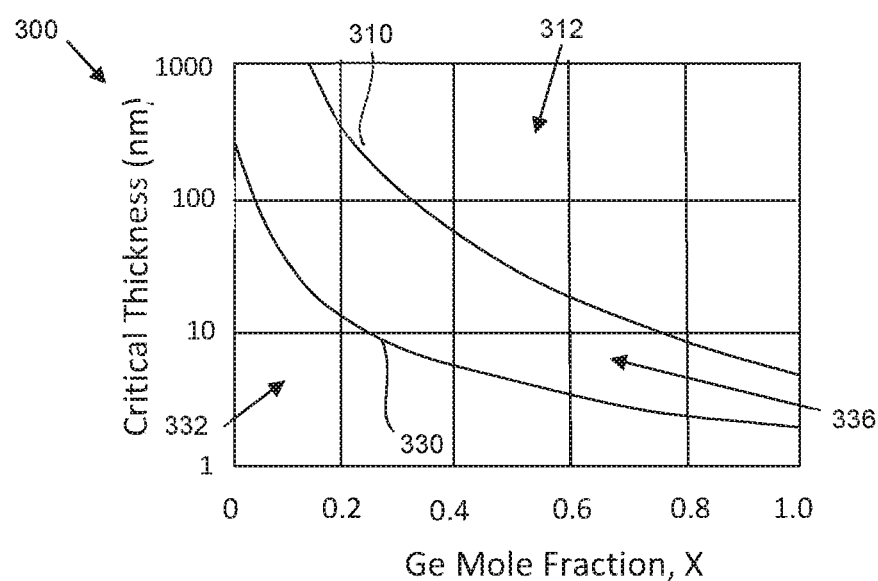
FIG. 3 is a chart of maximum germanium mole fraction as a function of layer thickness.

FIG. 3 is a chart 300 of maximum germanium mole fraction as a function of layer thickness. Trace 310 represents a critical thickness versus Ge mole fraction. At a given mole fraction, the graph shows the critical thickness for which the strained SiGe layer may become unstable, will relax and may form dislocations and/or other defects in the mixed crystal region 114. Area 312 represents this unstable condition above trace 310. At thicknesses well below the critical thickness, with a boundary represented by trace 330, the strained mixed crystal layer may be stable, as denoted by area 332 on graph 300. In the area 336 between trace 310 and trace 330, the mixed crystal layer may be metastable, according to an embodiment. In an embodiment, a Ge mole fraction of the mixed crystal region 114 may exceed ten percent. In other embodiments, the germanium mole fraction of the mixed crystal region 114 may exceed twenty percent. In still other embodiments, the Ge mole fraction of the mixed crystal region 114 may exceed thirty percent. In an embodiment, the Ge mole fraction and thickness of the mixed crystal region 114 may be configured so that the mixed crystal region 114 has a metastable characteristic (e.g. X=0.25, Ge thickness approximately 300 nm). In other embodiments, the Ge mole fraction and thickness of the mixed crystal region 114 may be configured so that the mixed crystal region 114 has a stable characteristic (e.g. X=0.12, Ge thickness approximately 20 nm). In still other embodiments, the Ge mole fraction and thickness of the mixed crystal region 114 may be configured so that the mixed crystal region 114 has an unstable characteristic (i.e. beyond the critical thickness for a given Ge mole fraction, e.g. X=0.4, Ge thickness approximately 300 nm).

Figure 4:
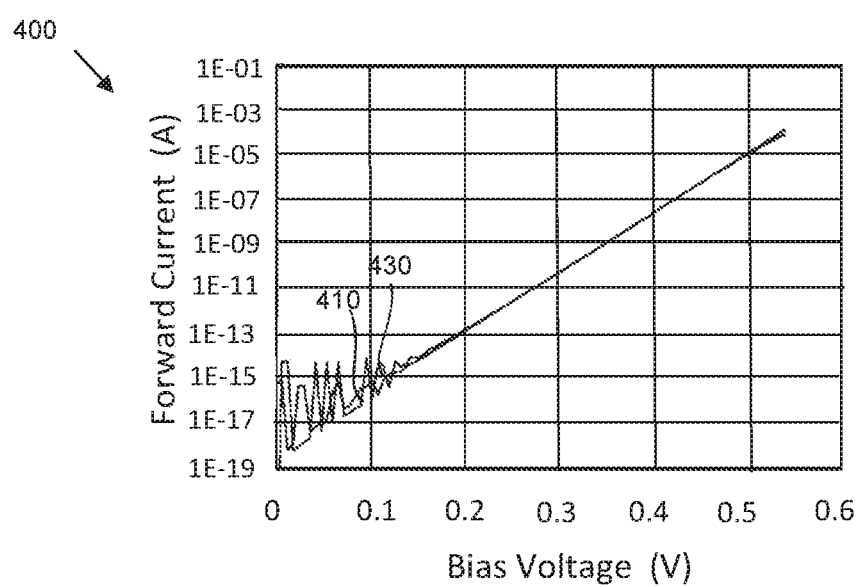
FIG. 4 is a chart of diode current versus diode voltage for the semiconductor device of FIG. 1 and in comparison, to that of a conventional device.

FIGS. 4-9 show the characteristics of the semiconductor device 100 in comparison with characteristics a conventional device based on device simulations. In these figures, the semiconductor device 100 may be configured as a diode device or as a radio frequency switch device. FIG. 4 is a chart 400 of diode current versus diode voltage for the semiconductor device 100 of FIG. 1 and in comparison, to that of a conventional device without a mixed crystal region. It should be appreciated that the current and capacitance values in FIGS. 4-7 are exemplary and that higher or lower current and capacitance values may be used according to the design preferences of a particular embodiment. Higher or lower current and capacitance values may be obtained by, for example, increasing or increasing the area of semiconductor device 100. According to an embodiment, the area of semiconductor device 100 may be adjusted by changing the number, length, and width of anodes 130, 132 and cathodes 140, 142 of FIG. 1. Trace 410 is a graphical representation of simulated current versus diode voltage for the semiconductor device 100 of FIG. 1. Trace 430 is a graphical representation of simulated diode current for the conventional device. As seen in chart 400, comparison of traces 410 and 430 show that the semiconductor device 100 of FIG. 1 and the conventional device have nearly identical diode current versus diode voltage characteristics. The nearly identical diode current versus diode voltage characteristics seen in the comparison of traces 410 and 430 results from semiconductor device 100 and conventional device having similar current capability.

Figure 5:
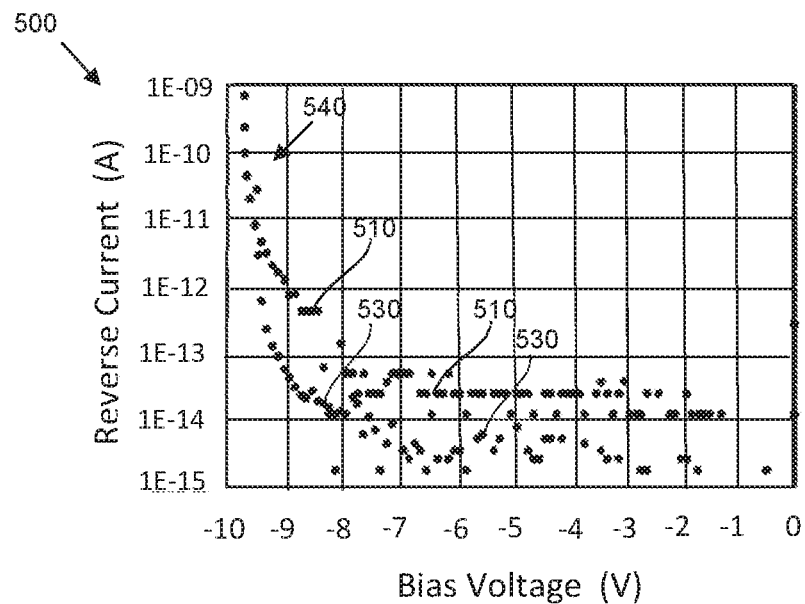
FIG. 5 is a chart of reverse current versus diode voltage for the semiconductor device of FIG. 1 in comparison to that of a conventional device.

FIG. 5 is a chart 500 of reverse current versus diode voltage for the semiconductor device 100 of FIG. 1 in comparison to that of a conventional device. Trace 510 is a graphical representation of the simulated current versus diode voltage for the semiconductor device 100 of FIG. 1. Trace 530 is a graphical representation of the simulated diode current for the conventional device. Region 540 indicates the breakdown voltage of the diode indicated by a sharp turn up in reverse current. As seen in chart 500, comparison of traces 510 and 530 show that the semiconductor device 100 of FIG. 1 and the conventional device have similar diode current versus diode reverse voltage characteristics. The similarity of diode current versus diode voltage characteristics and similar breakdown characteristic at point seen in the comparison of traces 510 and 530 results may arise from the semiconductor device 100 having the SiGe layer (i.e. mixed crystal region) kept within the depletion region 112. The breakdown voltage may not be affected by the presence of the Ge in the mixed crystal region, according to an embodiment.

Figure 6:
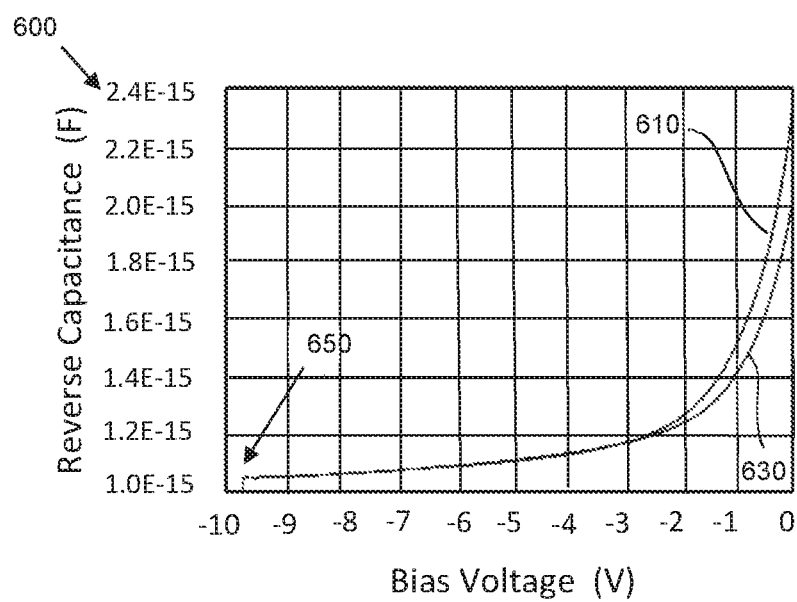
FIG. 6 is a chart of depletion capacitance versus bias voltage for the semiconductor devices of FIG. 1 in comparison with that of a conventional device.

FIG. 6 is a chart 600 of depletion capacitance versus bias voltage for the semiconductor device 100 of FIG. 1 in comparison with that of a conventional device. Trace 610 is a graphical representation of simulated depletion capacitance versus bias voltage for the semiconductor device 100 of FIG. 1, according to an embodiment. Trace 630 is a graphical representation of depletion capacitance versus frequency for a conventional device (no mixed crystal region). Region 650 shows the breakdown voltage achieved by the semiconductor device 100 of FIG. 1 and a conventional device, consistent with the chart 500 of reverse current in FIG. 5. It should be appreciated that this data is exemplary and that wide variations in capacitances and breakdown voltages may be achieved, depending on the design of semiconductor device 100 and the voltage available in the application. In other examples (not shown), diodes with higher or lower breakdown voltage may be used. As seen in the chart 600, traces 610 and 630 show that the semiconductor device 100 and the conventional device have very similar depletion capacitance characteristics. The similar depletion capacitance versus voltage characteristics seen in the comparison of traces 610 and 630 results from the equivalent areas and similar depletion region depths semiconductor device 100 of FIG. 1 and a conventional device.

Figure 7:
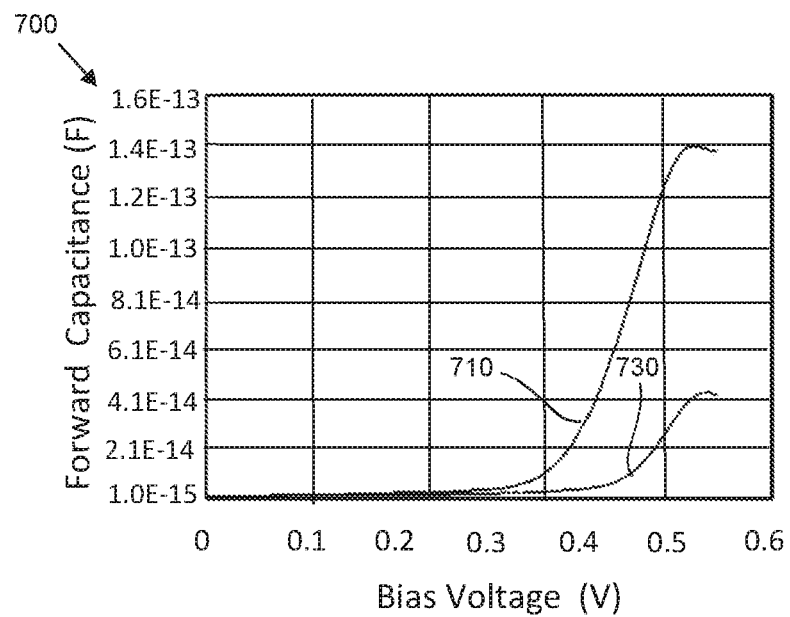
FIG. 7 is a chart of forward capacitance versus bias voltage for the semiconductor device of FIG. 1 in comparison with that of a conventional device.

FIG. 7 is a chart 700 of forward capacitance versus bias voltage for the semiconductor device 100 of FIG. 1 in comparison with that of a conventional device. Trace 710 is a graphical representation of the forward capacitance versus bias voltage for the semiconductor device 100 of FIG. 1. Trace 730 is a graphical representation of the simulated forward capacitance versus frequency the conventional device. The simulations represented in trace 710 and in trace 730 show a much larger capacitance value in forward bias for the semiconductor device 100. In an embodiment, the higher forward capacitance value may result in a lower insertion loss in radio frequency switch embodiments.

Figure 8:
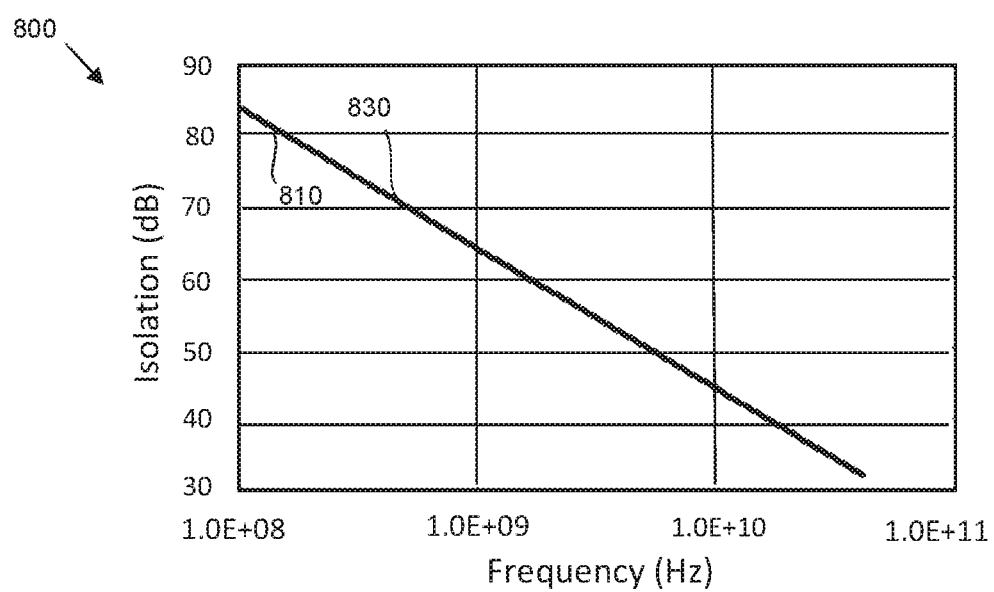
FIG. 8 is a chart of insolation versus frequency for the semiconductor device of FIG. 1 in comparison to that of a conventional device.

FIG. 8 is a chart 800 of isolation versus frequency in hertz for the semiconductor device 100 of FIG. 1 in comparison to that of a conventional device. As used herein, the term "isolation" refers to ratio of an input power delivered to the device, when the device is "off" to the output power transmitted through a device in response to the input power delivered to the device. Ideally the isolation is infinite, meaning that that a signal does not pass through the device (e.g., semiconductor device 100). In an embodiment, the isolation is determined when the device (e.g. semiconductor device 100) is off, e.g. in a reverse bias condition (i.e. when the switch is off). Trace 810 is a graphical representation of the simulated isolation versus frequency in hertz for the semiconductor device 100 of FIG. 1. Trace 830 is a graphical representation of the simulated isolation versus frequency for the conventional device. The measurements represented in trace 810 and in trace 830 are measurements of the isolation diode at a reverse bias voltage of −5 volts. As seen in chart 800, traces 810 and 830 show that the semiconductor device 100 of FIG. 1 and the conventional device 200 have approximately identical isolation versus frequency characteristics. The approximately identical isolation versus frequency characteristics seen in the comparison of traces 810 and 830 arise from the nearly equivalent depletion capacitance of semiconductor device 100 of FIG. 1 and the conventional device as seen in FIG. 6.

Figure 9A:
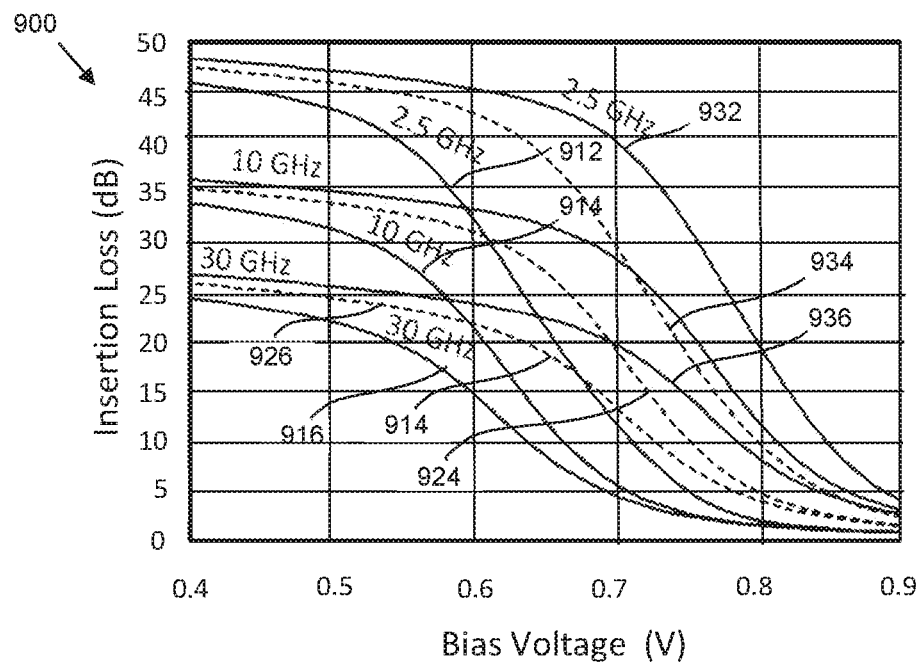
FIG. 9A is a chart of insertion loss versus bias voltage for the semiconductor device of FIG. 1 in comparison to that of a conventional device.
Figure 9B:
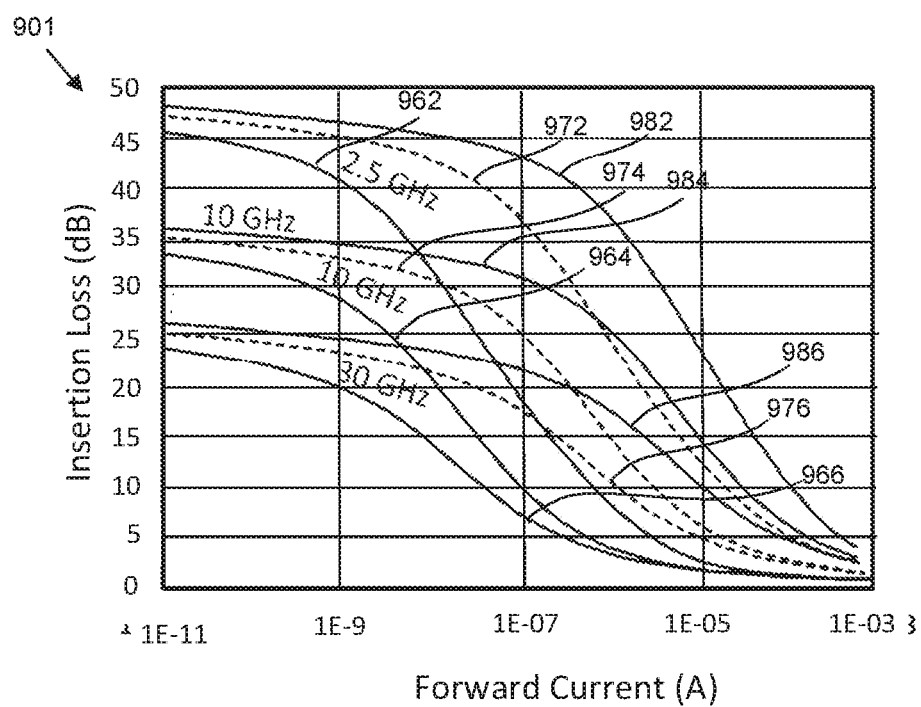
FIG. 9B is a chart of insertion loss versus current for the semiconductor device of FIG. 1 in comparison to that of a conventional device.

FIG. 9A is a chart 900 of insertion loss versus bias voltage for the semiconductor device 100 of FIG. 1 with 12% Ge and 24% Ge, consistent with traces 240 and 250 of FIG. 2, in comparison to that of a conventional device for 2.5 gigahertz (GHz), 10 GHz, and 30 GHz. As used herein, the term "insertion loss" refers to ratio of output power transmitted to a device in response to a given amount of input power delivered to a device when forward-biased in an "on" state. Traces 912, 914, and 916 graphically illustrate the performance of the semiconductor device 100 of FIG. 1 at 24% Ge mole fraction while traces 922, 924, and 926 represent the performance for a 12% Ge mole fraction at 2.5 GHz, 10 GHz, and 30 GHz, respectively. Traces 932, 934, and 936 compare the performance of a conventional device at 2.5 GHz, 10 GHz, and 30 GHz, respectively.

FIG. 9A is a chart 901 of insertion loss versus current for the semiconductor device 100 of FIG. 1 with 12% Ge and 24% Ge in comparison to that of a conventional device for 2.5 GHz, 10 GHz, and 30 GHz, respectively. Traces 962, 964, and 966 graphically illustrate the performance of the semiconductor device 100 of FIG. 1 at 24% Ge mole fraction while traces 972, 974, and 976 represent the performance for a 12% Ge mole fraction at 2.5 GHz, 10 GHz, and 30 GHz, respectively. Traces 982, 984, and 986 compare the performance of a conventional device.

The table below compares the insertion loss versus frequency for the semiconductor device 100 of FIG. 1 and a conventional device (without a mixed crystal region) at −1.5e-4 A and −6.5e-4A of current. As seen in the table and the charts of FIG. 9, the semiconductor device 100 of FIG. 1 has a lower insertion loss versus frequency than the conventional device in both on-state conditions. Of note, and as can be seen in FIG. 4, both the semiconductor device 100 of FIG. 1 and the conventional device may have substantially equal current. Thus, for a given current, in an embodiment, the semiconductor device 100 may have improved insertion loss than the conventional device 200. Also, it should be appreciated that the measurements represented by traces 912, 914, 916, 922, 924, 926, 932, 934, 936, 962, 964, 966, 972, 974, 976, 982, 984, and 986, are exemplary and that other bias points could be used (not shown). Similar trends (i.e. lower insertion loss for semiconductor device 100 of FIG. 1) may be seen for these other bias points.

The lower insertion loss versus frequency characteristics observed for the semiconductor device 100 of FIG. 1 (24% Ge, e.g. trace 240 of FIG. 2), as shown in the table below compared to the insertion loss versus frequency for the conventional device, arises from the higher diffusion capacitance realized by the semiconductor device 100 of FIG. 1 compared to the conventional device.

| Frequency (GHz) | Current (A) | Insertion Loss, Conventional Device (dB) | Insertion Loss, Semiconductor Device 100 (dB) |
| --- | --- | --- | --- |
| 2.5 |  | 9.2 | 2.0 |
| 10 | −1.5e-4 | 5.7 | 1.8 |
| 30 |  | 4.4 | 1.8 |
| 2.5 |  | 4.2 | 1.0 |
| 10 | −6.4e-4 | 3.2 | 0.9 |
| 30 |  | 2.8 | 0.9 |

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A semiconductor device comprising:
   a semiconductor substrate;
   a first semiconductor region comprising a first material of a first polarity formed within the semiconductor substrate;
   a second semiconductor region comprising the first material of a second polarity formed within the semiconductor substrate and coupled to the first semiconductor region;
   a first electrode coupled to the first semiconductor region;
   a second electrode coupled to the second semiconductor region;
   a depletion region formed between the first semiconductor region and the second semiconductor region; and
   an isolation region formed adjacent the first semiconductor region and the second semiconductor region;
   wherein the depletion region comprises a mixed crystal region that includes a mixed crystal alloy of the first material and a second material, and wherein the mixed crystal region has a lower bandgap energy than a bandgap energy of the first material.

2. The semiconductor device of claim 1, wherein the polarity of the first semiconductor region is p-type and the polarity of the second semiconductor region is n-type.

3. The semiconductor device of claim 1, wherein the first electrode is configured as an anode and the second electrode is configured as a cathode.

4. The semiconductor device of claim 1, wherein the mixed crystal region includes an intrinsically doped semiconductor.

5. The semiconductor device of claim 1, wherein the first material and the semiconductor substrate comprise silicon and the second material comprises germanium, wherein the mixed crystal region includes silicon-germanium.

6. A semiconductor device comprising:
   a semiconductor substrate;
   a first semiconductor region comprising a first material of a first polarity formed within the semiconductor substrate;
   a second semiconductor region comprising the first material of a second polarity formed within the semiconductor substrate and coupled to the first semiconductor region;
   a first electrode coupled to the first semiconductor region;
   a second electrode coupled to the second semiconductor region; and
   a depletion region formed between the first semiconductor region and the second semiconductor region:
   wherein the depletion region comprises a mixed crystal region that includes a mixed crystal alloy of the first material and a second material, wherein the mixed crystal region has a lower bandgap energy than a bandgap energy of the first material, wherein the first material and the semiconductor substrate comprise silicon and the second material comprises germanium, wherein the mixed crystal region includes silicon-germanium, and wherein a germanium mole fraction of the mixed crystal region exceeds ten percent.

7. The semiconductor device of claim 6, wherein the germanium mole fraction of the mixed crystal region exceeds twenty percent.

8. The semiconductor device of claim 7, wherein the germanium mole fraction of the mixed crystal region exceeds thirty percent.

9. A semiconductor device comprising:
a semiconductor substrate;
a first semiconductor region comprising a first material of a first polarity formed within the semiconductor substrate;
a second semiconductor region comprising the first material of a second polarity formed within the semiconductor substrate and coupled to the first semiconductor region;
a first electrode coupled to the first semiconductor region;
a second electrode coupled to the second semiconductor region; and
a depletion region formed between the first semiconductor region and the second semiconductor region;
wherein the depletion region comprises a mixed crystal region that includes a mixed crystal alloy of the first material and a second material, wherein the mixed crystal region has a lower bandgap energy than a bandgap energy of the first material, wherein the first material and the semiconductor substrate comprise silicon and the second material comprises germanium, wherein the mixed crystal region includes silicon-germanium, and wherein a germanium mole fraction and a thickness of the mixed crystal region are configured so that the mixed crystal region has a metastable characteristic.

10. A diode device comprising:
a silicon substrate;
a first semiconductor region comprising silicon of a first polarity formed within the silicon substrate;
a second semiconductor region comprising silicon of a second polarity formed within the silicon substrate and coupled to the first semiconductor region;
a first electrode coupled to the first semiconductor region;
a second electrode coupled to the second semiconductor region;
an isolation region adjacent the first semiconductor region and the second semiconductor region;
a depletion region formed between the first semiconductor region and the second semiconductor region; and
a mixed crystal region formed within the depletion region, wherein the mixed crystal region includes a mixed crystal alloy of silicon germanium, and wherein the mixed crystal region has a lower bandgap energy than a bandgap energy of the first semiconductor region.

11. The diode device of claim 10, wherein the first semiconductor region of the first polarity is a p-type semiconductor and the second semiconductor region of the second polarity is a n-type semiconductor.

12. The diode device of claim 10, further comprising a third semiconductor region formed between the first semiconductor region and the second semiconductor region, wherein at least a portion of the mixed crystal region includes the third semiconductor region, and wherein the third semiconductor region includes an intrinsically doped semiconductor.

13. The diode device of claim 10, wherein a germanium mole fraction of the mixed crystal region exceeds ten percent.

14. The diode device of claim 13, wherein the germanium mole fraction of the mixed crystal region exceeds twenty percent.

15. The diode device of claim 14, wherein the germanium mole fraction of the mixed crystal region exceeds thirty percent.

16. A radio frequency switch device comprising:
a silicon substrate;
a first semiconductor region comprising p-type silicon formed within the silicon substrate;
a second semiconductor region comprising n-type silicon formed under the first semiconductor region;
a first electrode, configured as an anode, formed over and coupled to the first semiconductor region;
a second electrode, configured as a cathode, formed adjacent the first electrode and coupled to the second semiconductor region;
an isolation region adjacent the first semiconductor region and the second semiconductor region;
a depletion region formed between the first semiconductor region and the second semiconductor region; and
a mixed crystal region formed within the depletion region that includes a mixed crystal alloy of silicon germanium, wherein the mixed crystal region has a lower bandgap energy than a bandgap energy of silicon.

17. The radio frequency switch device of claim 16, further comprising:
a third semiconductor region comprising p-type silicon formed within the silicon substrate over the second semiconductor region;
a third electrode formed over and coupled to the third semiconductor region and the first electrode;
a fourth electrode formed over and coupled to the second semiconductor region; and
a mixed crystal region formed within the depletion region that includes a mixed crystal alloy of silicon germanium, wherein the mixed crystal region has a lower bandgap energy than a bandgap energy of silicon.

18. The semiconductor device of claim 16, further comprising a third semiconductor region formed between the first semiconductor region and the second semiconductor region, wherein at least a portion of the mixed crystal region includes the third semiconductor region, and wherein the third semiconductor region includes an intrinsically doped semiconductor.

* * * * *